(12) United States Patent
Grivna et al.

(10) Patent No.: US 9,553,165 B2
(45) Date of Patent: Jan. 24, 2017

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventors: Gordon M. Grivna, Mesa, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/176,603

(22) Filed: Jun. 8, 2016

(65) Prior Publication Data

US 2016/0284814 A1 Sep. 29, 2016

Related U.S. Application Data

(62) Division of application No. 14/665,175, filed on Mar. 23, 2015, now Pat. No. 9,391,135.

(51) Int. Cl.

| | |
|---|---|
| *H01L 29/06* | (2006.01) |
| *H01L 29/66* | (2006.01) |
| *H01L 29/739* | (2006.01) |
| *H01L 21/265* | (2006.01) |
| *H01L 21/304* | (2006.01) |
| *H01L 21/306* | (2006.01) |
| *H01L 21/3065* | (2006.01) |
| *H01L 21/762* | (2006.01) |
| *H01L 29/417* | (2006.01) |

(52) U.S. Cl.
CPC ....... *H01L 29/66333* (2013.01); *H01L 21/265* (2013.01); *H01L 21/3043* (2013.01); *H01L 21/3065* (2013.01); *H01L 21/30625* (2013.01); *H01L 21/76224* (2013.01); *H01L 29/0619* (2013.01); *H01L 29/0649* (2013.01); *H01L 29/7397* (2013.01); *H01L 29/41766* (2013.01); *H01L 29/66348* (2013.01)

(58) Field of Classification Search
CPC .. H01L 29/06; H01L 29/7813; H01L 29/4236; H01L 29/0615; H01L 29/739
See application file for complete search history.

(56) References Cited

U.S. PATENT DOCUMENTS

| | | | |
|---|---|---|---|
| 6,621,136 | B2 | 9/2003 | Grivna |
| 6,683,343 | B2 | 1/2004 | Matsudai et al. |
| 7,087,925 | B2 | 8/2006 | Grivna |
| 7,253,477 | B2 | 8/2007 | Loechelt et al. |
| 7,579,632 | B2 | 8/2009 | Salih et al. |
| 7,781,310 | B2 | 8/2010 | Grivna |
| 7,842,969 | B2 | 11/2010 | Marreiro et al. |
| 7,989,319 | B2 | 8/2011 | Grivna et al. |
| 8,012,857 | B2 | 9/2011 | Grivna et al. |

(Continued)

OTHER PUBLICATIONS

A. Lindemann, "A New IGBT with Reverse Blocking Capability," Entwurf fur EPE Conference, Graz; IXAN0049;1-7 (2001).

(Continued)

*Primary Examiner* — Phuc Dang
(74) *Attorney, Agent, or Firm* — Robert F. Hightower

(57) ABSTRACT

In one embodiment, an IGBT is formed to include a plurality of termination trenches in a termination region of the IGBT. An embodiment may include that one end of one or more termination trenches may be exposed on one surface of the semiconductor device.

6 Claims, 9 Drawing Sheets

(56) References Cited

U.S. PATENT DOCUMENTS

| | | | |
|---|---|---|---|
| 8,492,260 | B2 | 7/2013 | Parsey, Jr. et al. |
| 9,142,665 | B2 | 9/2015 | Hirler et al. |
| 2002/0030225 | A1* | 3/2002 | Nakamura .......... H01L 29/0615 257/338 |
| 2002/0137264 | A1 | 9/2002 | Kao et al. |
| 2005/0176192 | A1 | 8/2005 | Hshieh |
| 2012/0187527 | A1 | 7/2012 | Guitart et al. |
| 2013/0277807 | A1 | 10/2013 | Parsey, Jr. et al. |
| 2014/0070375 | A1 | 3/2014 | Grivna |
| 2015/0235866 | A1* | 8/2015 | Nakamura .......... H01L 21/3221 257/77 |
| 2015/0357437 | A1 | 12/2015 | Vellei |
| 2015/0380247 | A1* | 12/2015 | Horii .................... H01L 21/046 438/400 |

OTHER PUBLICATIONS

E.R. Motto et al., "Application Characteristics of an Experimental RB-IGBT (Reverse Blocking IGBT) Module," IEEE, 0-7803-8480-03;5 pages (2004).

* cited by examiner

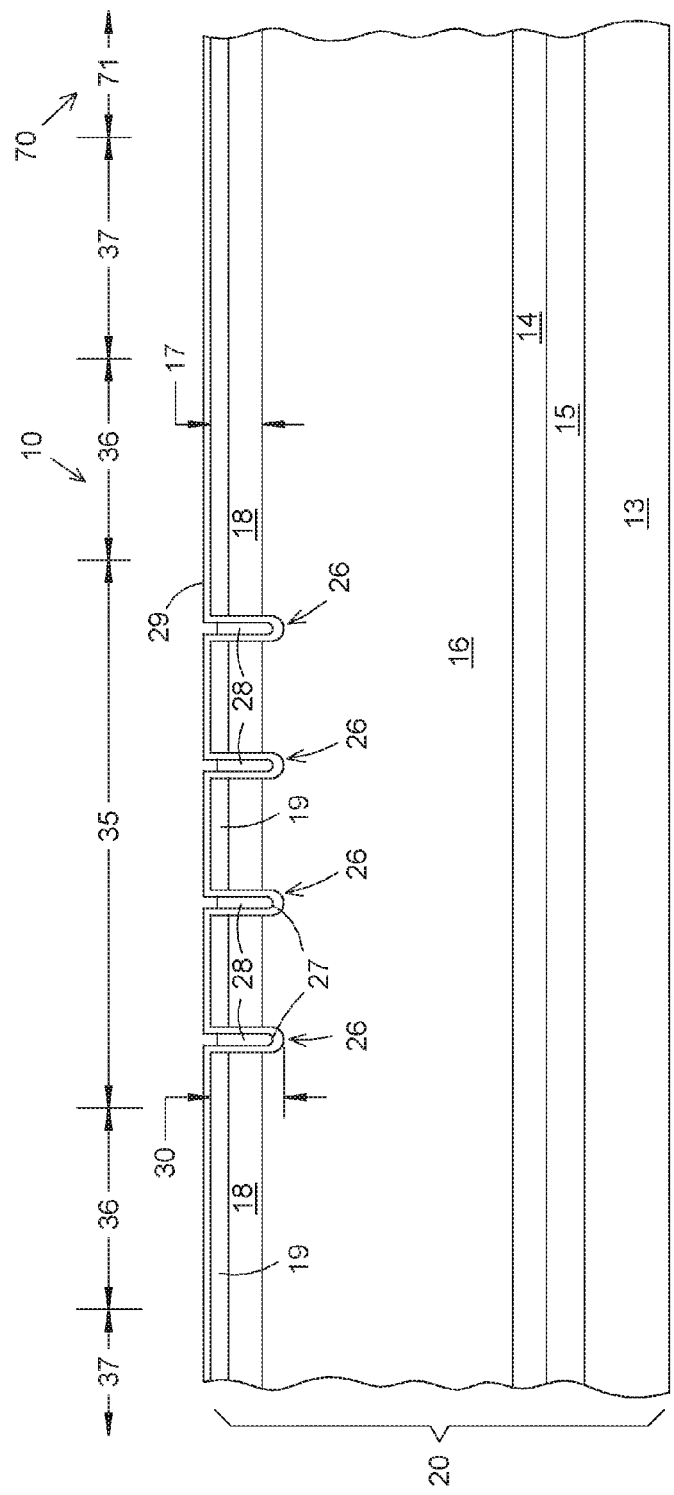

METHOD OF FORMING A SEMICONDUCTOR DEVICE

The present application is a divisional application of prior U.S. application Ser. No. 14/665,175, filed on Mar. 23, 2015, which is hereby incorporated herein by reference, and priority thereto for common subject matter is hereby claimed.

BACKGROUND OF THE INVENTION

The present invention relates, in general, to electronics, and more particularly, to semiconductors, structures thereof, and methods of forming semiconductor devices.

In the past, the semiconductor industry utilized various methods and structures for forming reverse blocking (RB) insulated gate bipolar transistors (IGBTs). The RB IGBT (RB-IGBT) typically was an IGBT that had a low forward bias but could withstand a large reverse bias. The manufacturing cost for most RB-IGBTs was high because, among other things, most RB-IGBTs required a large area to form the diffused junction termination region of the RB-IGBT. The large area used for the termination region increased the die size and also increased the manufacturing cost. Additionally, most RB-IGBTs had a relatively slow switching speed because of the high minority carrier densities for the junction termination region and/or for other isolation regions.

Accordingly, it is desirable to have an IGBT that has a lower manufacturing cost, that has a narrower termination region, or that has a faster switching time.

BRIEF DESCRIPTION OF THE DRAWINGS

FIG. 3 illustrates the IGBT of FIG. 1 at one stage of an example of an embodiment of a method of forming the IGBT in accordance with the present invention;

FIG. 4 illustrates a subsequent stage in an example embodiment of a method of forming the IGBT of FIG. 1 in accordance with the present invention;

Figure 1:
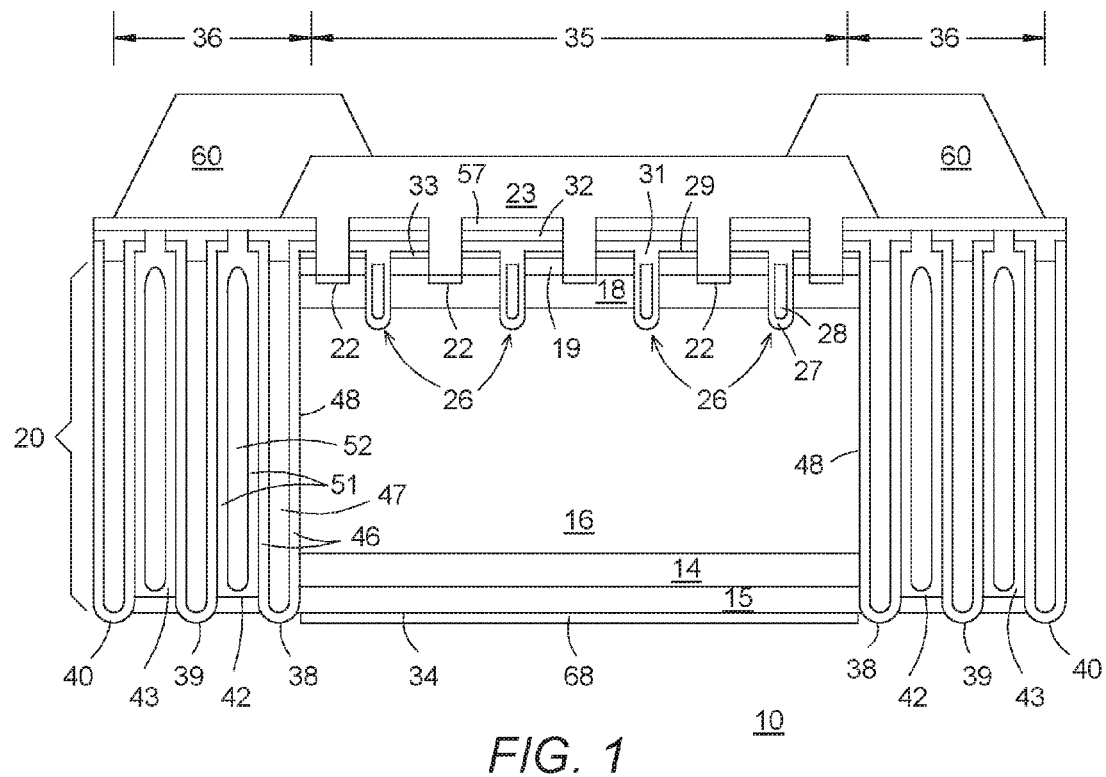
FIG. 1 illustrates an enlarged cross-sectional portion of an embodiment of an example of a portion of an IGBT in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 illustrates an enlarged cross-sectional portion of an embodiment of an example of a portion of an IGBT 10. An embodiment of IGBT 10 may be formed to withstand a high reverse voltage. In some embodiments, IGBT 10 may be formed to withstand a high reverse voltage of at least approximately six hundred volts (600V). Thus, IGBT 10 may also be a RB-IGBT. IGBT 10 is formed to include an active region or active area 35 in which active elements are formed. The active elements may include source regions, gate structures, channel regions, drift regions, or other active elements of IGBT 10. IGBT 10 also may be formed to include a termination area or termination region 36 that is used to terminate electric fields that may be formed during the operation of IGBT 10. Those skilled in the art will appreciate that in an embodiment termination region 36 may surround active area 35. An embodiment may include the region 36 may surround an outer periphery of active area 35. An embodiment may include that termination region 36 forms a multiply-connected topology that surrounds an outer perimeter of active area 35. Those skilled in the art will understand that "multiply-connected topology" or "multiply-connected" means a class of connected shape(s) or domain(s) that have an opening or hole through the shape, such as the non-limiting example of a doughnut having a doughnut hole through the doughnut. The periphery of the shape can be circular or parallelogram or any other shape including an irregular shape. The opening may be located in any interior position of the shape.

In an embodiment, termination region 36 may include a plurality of termination trenches that surround the outer periphery or perimeter of active area 35. For example, the plurality of termination trenches may include termination trenches such as termination trenches 38-42.

IGBT 10 is formed on a semiconductor substrate 20. An embodiment of IGBT 10 typically includes a doped region 15 that functions as a drain region of IGBT 10, a doped region 19 that functions as a source region, and a plurality of gate structures 26 that are used to control current flow through IGBT 10. Those skilled in the art will appreciate that doped region 15 may also function as an anode of a diode. A body region of IGBT 10 may be formed as a doped region 18, and a drift region may be formed by a doped region 16. In some embodiments, region 18 may be referred to as a PHV region or body region of IGBT 10. An embodiment may include forming region 15 as a P-type region, regions 16 and optional region 14 as N-type regions, region 18 as a P-type region, and region 19 as an N-type region. An embodiment may include that a P-N junction is formed between region 15 and an adjacent region. An embodiment may include that region 36 may surround an outer periphery of doped region 36. For example, an inner periphery 48 of region 36 may surround active area 35 or alternately may surround the outer periphery of doped region 16. In most embodiments, doped regions 18 and 15 have a conductivity type that is opposite to the conductivity type of doped regions 14, 16, and 19. In an embodiment, regions 15 and 19 may have a higher peak doping concentration than region 16. Region 18 may have a peak doping concentration that is higher than region 16 and in one embodiment no higher than regions 15 and 19. In some embodiments, region 19 may have a higher doping concentration than region 14. An embodiment of gate structures 26 may be formed to extend from a surface of substrate 20 through region 19 and at least into region 18. In an embodiment, structures 26 may also extend through region 18. Substrate 20 may include a surface 33 that is a surface on which region 19 is formed, and a surface 34 which is a surface opposite to surface 33.

In general, a device with a relatively shallow p-n junction at or in the vicinity of the back of the substrate on which the device is formed, may benefit from an isolation or passivation to minimize leakage from the p-n junction. Examples of such devices may include IGBT, or a back side diode, such as back-to-back diodes. In an embodiment, device 10 may be formed to include such an isolation region. For example, in an embodiment, trenches 38-40 or alternately the insulators thereof, may form a portion of such isolation near surface 34 of substrate 20.

Figure 2:
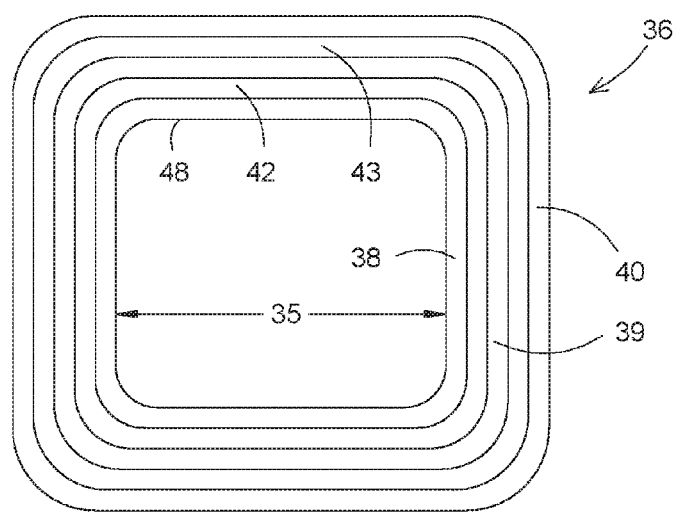
FIG. 2 illustrates an enlarged plan view of a portion of an embodiment of the IGBT of FIG. 1 in accordance with the present invention.

FIG. 2 illustrates an enlarged plan view of a portion of an embodiment of IGBT 10. FIG. 2 illustrates one example embodiment of a portion of a multiply-connected topology that may be included in an embodiment of IGBT 10. Termination trenches 38-40 are illustrated as surrounding an outer periphery of active area 35.

FIG. 3 illustrates IGBT 10 at one stage of an example of an embodiment of a method of forming IGBT 10. Doped region 15 may be formed on a surface of a bulk silicon semiconductor substrate 13. Region 15 may be formed on substrate 13 by doping portions of substrate 13 or may be formed as an epitaxial layer that is formed on the surface of substrate 13. An optional buffer layer may be formed as a doped region 14 on a surface of doped region 15. Region 14 may be formed by doping a portion of region 15 or may be formed as an epitaxial layer on region 15. Substrate 13 may have the same conductivity type as region 15 or may have a different conductivity type.

FIG. 4 illustrates a subsequent stage in an example embodiment of a method of forming IGBT 10. IGBT 10 typically is formed on a semiconductor wafer along with other semiconductor devices. For example, IGBT 10 may be formed on a semiconductor wafer along with other IGBTs that may or may not be similar to IGBT 10. FIG. 4 illustrates an example of a cross-sectional portion of such a wafer that includes IGBT 10 and another semiconductor device 70 that is near to IGBT 10. Device 70 may also include a termination region 71. Region 71 may be similar to region 36. Device 70 may be another IGBT that is similar to IGBT 10 or may be another semiconductor device. IGBT 10 is separated from device 70 on the semiconductor wafer by singulation regions 37. Regions 37 are portions of the semiconductor wafer that may be removed or destroyed in some manner to singulate semiconductor devices, such as for example IGBT 10 and device 70, from each other and from the semiconductor wafer so the semiconductor devices may be packaged. The portions of the semiconductor wafer in regions 37 may be removed by operations referred to as singulation or dicing. Singulation may include scribing and breaking, laser ablation, saw singulation, or other known singulation techniques to remove portions of the wafer in regions 37. As will be seen further hereinafter, the singulation may also be performed by dry dicing techniques such as those explained in U.S. Pat. No. 7,781,310 issued to Gordon Grivna on Aug. 24, 2010 which is hereby incorporated herein by reference.

An embodiment of an example of a method of forming IGBT 10 may include that doped region 16 may be formed overlying the surface of region 15. For example, region 16 may be formed as an epitaxial layer on a surface of region 14, or alternately on a surface of region 15. Alternately a portion of region 14 or alternately a portion of region 15 may be doped to form region 16.

Subsequently, portions of gate structures 26 may be formed. Openings for gate structures 26 may be formed to extend a distance 30 into substrate 20 from a surface of substrate 20, or in another embodiment from a surface of region 16. An insulator 27 may be formed on the sidewalls and the bottom of the openings. A portion of insulator 27 may function as the gate insulator for structures 26. In some embodiments, the thickness of insulator 27 may be greater on the bottom portion of the openings than on the sidewalls of the openings. In some embodiments, the step of forming insulator 27 may also form an insulator 29 on the surface of substrate 20. The process of forming insulator 27 in the openings typically leaves a space or opening on the interior between the interior sides of the sidewalls of insulator 27. A gate conductor 28 may be formed within the opening between the sidewalls of insulator 27 and on the portion of insulator 27 on the bottom of the opening. In an embodiment, the conductor may be a doped polysilicon.

Doped region 18 may be formed on the surface of region 16. In an embodiment, region 18 can be formed to extend a distance 17 from the surface of substrate 20 into substrate 20. In an alternate embodiment region 18 may be formed to extend distance 17 into region 16. In an embodiment, region 18 may be formed by doping a portion of region 16.

Thereafter, doped region 19 may be formed on the surface of substrate 20. In an embodiment, region 19 may be formed on a surface of region 18 to extend into region 18. For example, region 19 may be formed by doping a portion of region 18. An embodiment may include forming region 19 positioned in region 18.

Those skilled in the art will appreciate that the order may be changed. For example, regions 18 and 19 may be formed on the surface of substrate 20 prior to forming the openings for gate structures 26. Alternatively, regions 18 and 19 may be formed on the surface of region 16 prior to forming the openings for gate structures 26. For example, an embodiment may include forming region 18 as an epitaxial layer on a surface of region 16. An embodiment may include forming region 19 either as an epitaxial layer on region 18 or by doping a portion of region 18.

In an embodiment, conductor 28 may not extend to the surface of substrate 20 but may be recessed below the surface of substrate 20. For example, when the opening between the sidewalls of insulator 27 is filled with conductor material in order to form conductor 28, the conductor material may extend to the surface of substrate 20. However, the conductor material may be etched in order to recess conductor 28 below the surface of substrate 20.

Figure 5:
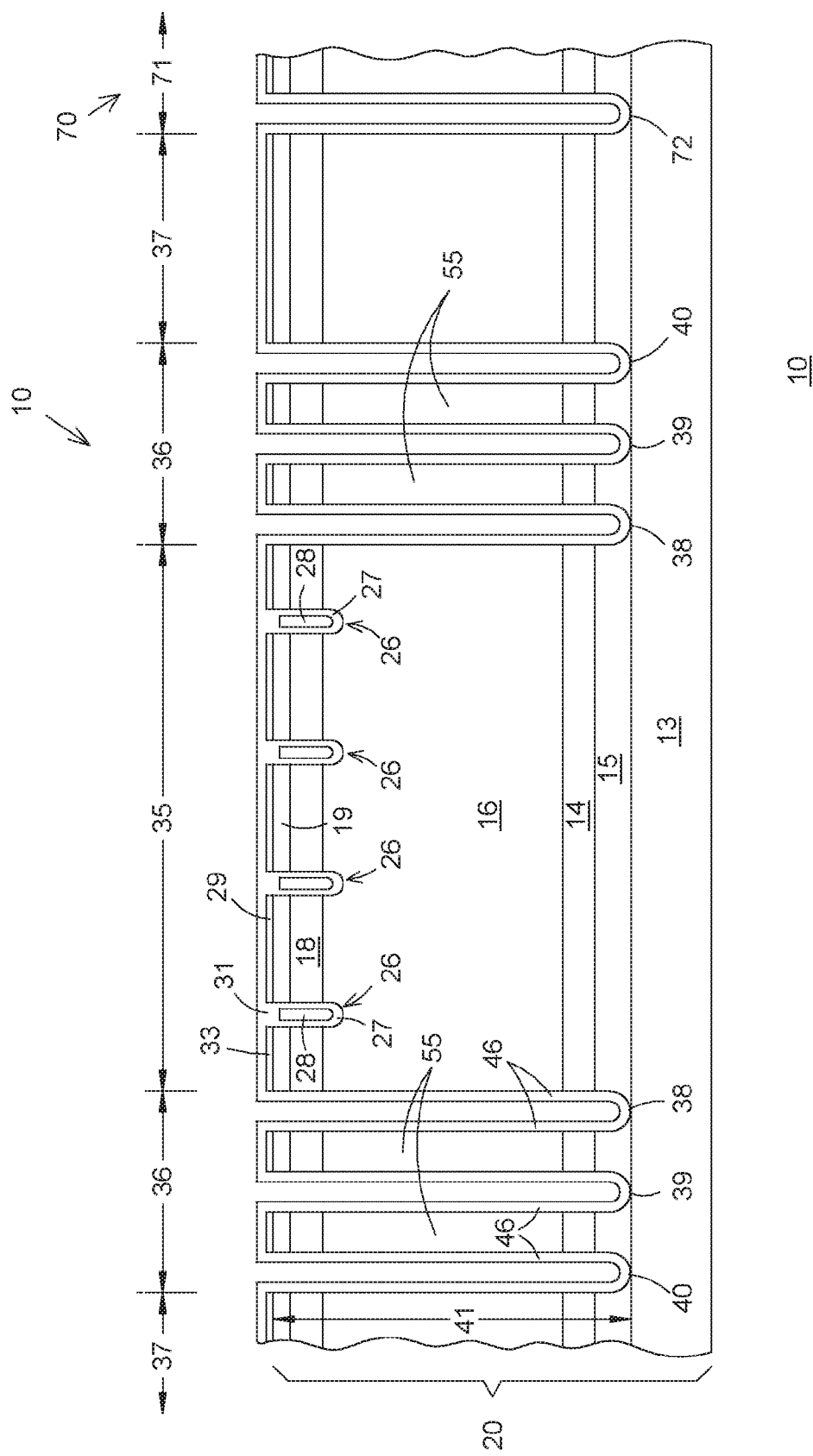
FIG. 5 illustrates a subsequent stage in an example of an embodiment of a method of forming the IGBT of FIG. 1 in accordance with the present invention.

FIG. 5 illustrates a subsequent stage in an example of an embodiment of a method of forming IGBT 10. In an embodiment, trenches 38, 39, and 40 may be formed prior to forming trenches 42 and 43 (FIG. 1). Openings for trenches 38, 39, and 40 are formed to extend a distance 41 from the surface of substrate 20 through region 16 and at least into region 15. In other embodiments, the openings may be formed to extend through region 15 or alternately into bulk semiconductor substrate 13. In an embodiment, trenches 38, 39, and 40 may be spaced apart from each other leaving a first portion 55 of substrate 20 between trenches 38 and 39 and a second portion 55 of substrate 20 between trenches 39 and 40. In an embodiment, portions 55 form pillars of semiconductor material disposed between trenches 38 and 39 and between trenches 39 and 40. The trenches may have an embodiment in which a width thereof is a little wider that a width of portions 55. An embodiment may include that the width of each portion 55 may be approximately equal to a width of an adjacent trench. For example, the width of portion 55 between trenches 38 and 39 may be approximately equal to the width of either of trenches 38 or 39.

Thereafter, an insulator 46 may be formed on the sidewalls and bottoms of the openings. An embodiment may include that insulator 46 is formed on the surfaces of the openings formed for trenches 42 and 43. In some embodiments the insulator may also be formed on the surface of substrate 20 and extend into the openings of gate structures 26 over conductor 28 to form an insulator 31 covering the top of conductors 28. Insulators 46 and 31 may be formed by thermal oxidation, or by deposition, such as for example a tetraethyl orthosilicate (TEOS) deposition, or by other means. Forming insulators 46 may in some embodiments leave a space or opening 47 interior to each of trenches 38-40. In an embodiment, opening 47 may expose an interior portion of the sidewalls of insulator 46.

Figure 6:
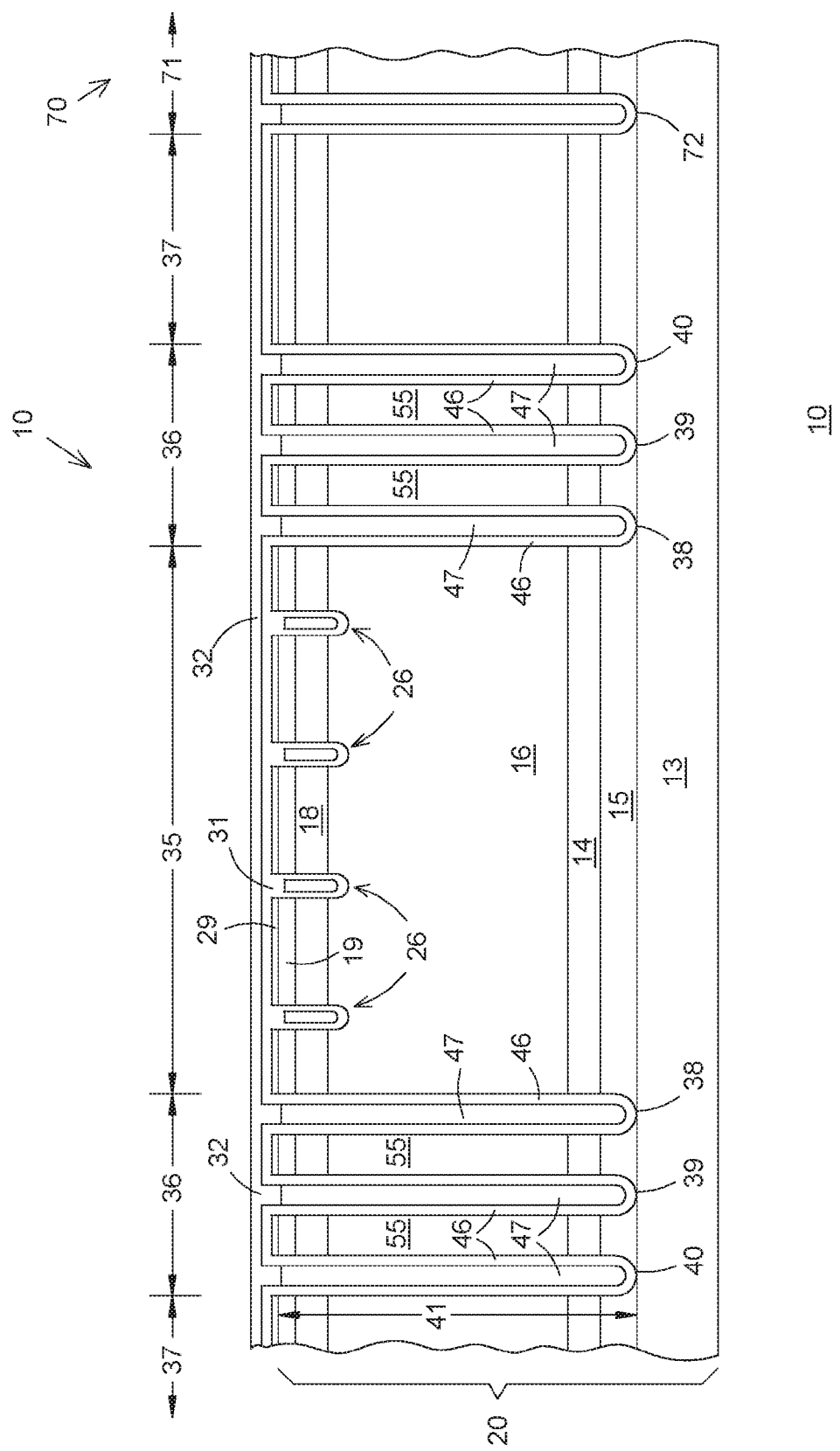
FIG. 6 illustrates another subsequent stage in an example embodiment of a method of forming the IGBT of FIG. 1 in accordance with the present invention.

FIG. 6 illustrates another subsequent stage in an example embodiment of a method of forming IGBT 10. A cap insulator 32 may be formed on trenches 38-40. In an embodiment, cap insulator 32 may be formed to cover at least the openings formed between the sidewalls of insulator 46. In some embodiments, insulator 32 may also cover insulator 46. Some embodiments may include that a portion of insulator 32 may extend a small distance into the opening between the interior sidewalls of insulator 46. Forming cap insulator 32 to cover the opening formed by insulators 46 results in leaving space 47 as a space interior to each of trenches 38-40 thereby leaving an opening in the interior of each of trenches 38, 39, and 40. Space 47 may assist in increasing the breakdown voltage of IGBT 10. For a non-limiting example, space 47 may increase the breakdown voltage of IGBT 10 when the voltage is applied laterally across IGBT 10. In some embodiments, space 47 may be formed as a vacuum or partial vacuum, or may be filled with a gas. In other embodiments, space 47 may be evacuated so that the pressure internal to the space is less than atmospheric pressure.

Figure 7:
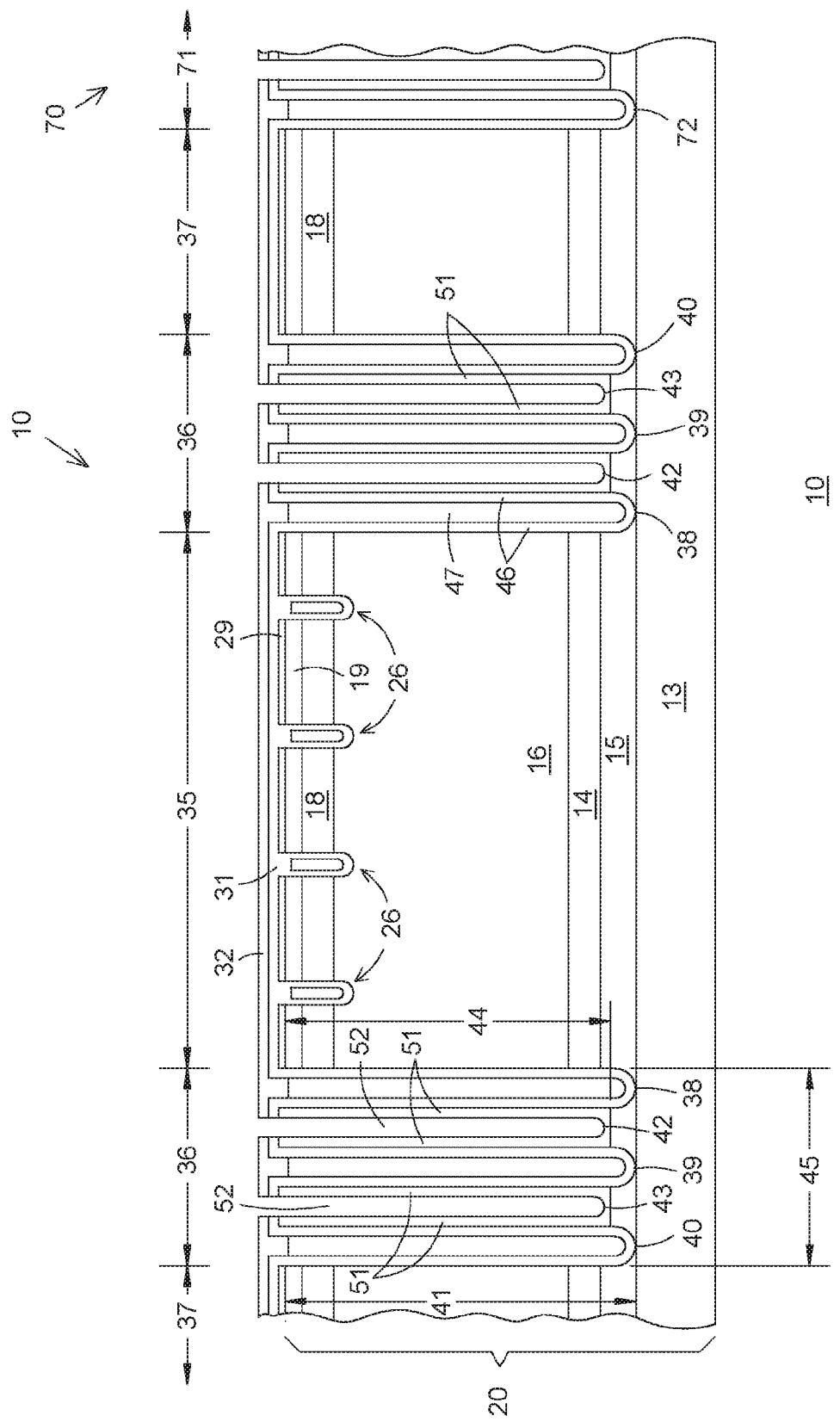
FIG. 7 illustrates another subsequent stage in the example embodiment of a method of forming the IGBT of FIG. 1 in accordance with the present invention.

FIG. 7 illustrates another subsequent stage in the example embodiment of a method of forming IGBT 10. Portions 55 of substrate 20 are removed to form an opening between trenches 38 and 39 and an opening between trenches 39 and 40. The openings extend a distance 44 at least into region 15. In an embodiment, distance 44 may be less than distance 41. In other embodiments, distance 44 may be greater than or may be approximately equal to distance 41. In an embodiment, removing portions 55 may expose the outer sidewalls of insulators 46, thus, the outer sidewalls of insulator 46 that is disposed between trenches 38 and 39 and the outer sidewalls of insulator 46 that is disposed between trenches 39 and 40.

An insulator 51 may be formed along the sidewalls of the openings used for trenches 42 and 43. An embodiment may include forming insulator 51 on the surface of the opening formed for trenches 42-43. In an embodiment, insulator 51 may be formed along the outer sidewalls of insulators 46 and along the bottom of the opening formed for trenches 42 and 43. Forming insulator 51 along the surfaces of the openings used for trenches 42 and 43 results in a space or opening 52 in the interior of each of trenches 42 and 43 and positioned between the sidewalls and bottom of insulator 51. In an embodiment, insulators 51 may be formed by depositing TEOS into the openings of trenches 42 and 43 followed by an etch to remove portions of the TEOS to form openings 52 and leave portions of the TEOS on the sidewalls and bottom of the openings of trenches 42 and 43. Some embodiments may include that the operation of forming insulator 51 results in forming more of insulator 51 in the opening near surface 33. In some embodiments the additional amount of insulator 51 may close the mouth of the opening near or at surface 33 leaving opening 52 in the interior of trenches 42-43. In some embodiments, space 52 may be formed as a vacuum, or partial vacuum, or may be filled with a gas. In other embodiments, space 52 may be evacuated so that the pressure internal to the space is less than atmospheric pressure.

Figure 8:
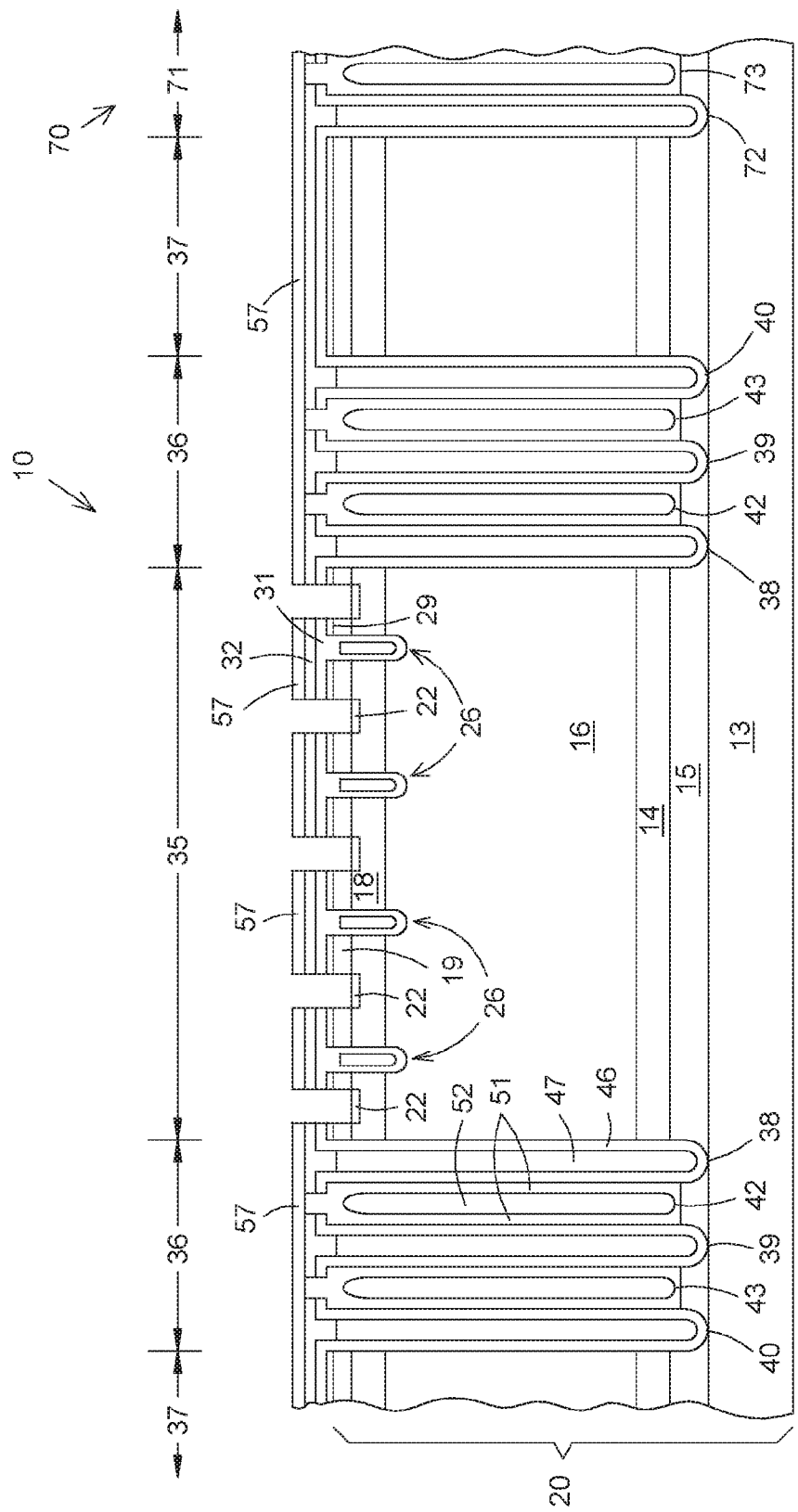
FIG. 8 illustrates the IGBT of FIG. 1 at another subsequent stage in accordance with the present invention.

FIG. 8 illustrates IGBT 10 at another subsequent stage. An insulator 57 may be formed as a cap layer to cover the end of the opening of trenches 42 and 43 that is toward the surface of substrate 20. In an embodiment, insulator 57 may be formed on the entire surface of substrate 20. In some embodiments, a portion of insulator 57 may extend a small distance into openings 52. Insulator 57 may be silicon dioxide, silicon nitride, silicon oxy-nitride or other types of insulating material. Space 52 may also assist in increasing the breakdown voltage of IGBT 10 such as the non-limiting example of a lateral breakdown voltage.

In other embodiments, opening 47 in trenches 38-40 and/or openings 52 may be filled with undoped semiconductor material, such as for example undoped polysilicon, or alternately may be filled with doped semiconductor material, such as for example doped polysilicon prior to forming respective insulators 32 and 57.

Thereafter, ohmic contact regions may be formed to facilitate forming a low resistance electrical connection to region 18. Openings can be formed through insulators 57, 32, 31, and 29 to expose portions of the surface of substrate 20. In an embodiment the openings are extended through exposed portions of regions 19 to expose a portion of the surface of region 18. Doped regions 22 may be formed in region 18 to facilitate the low resistance electrical connection.

Figure 9:
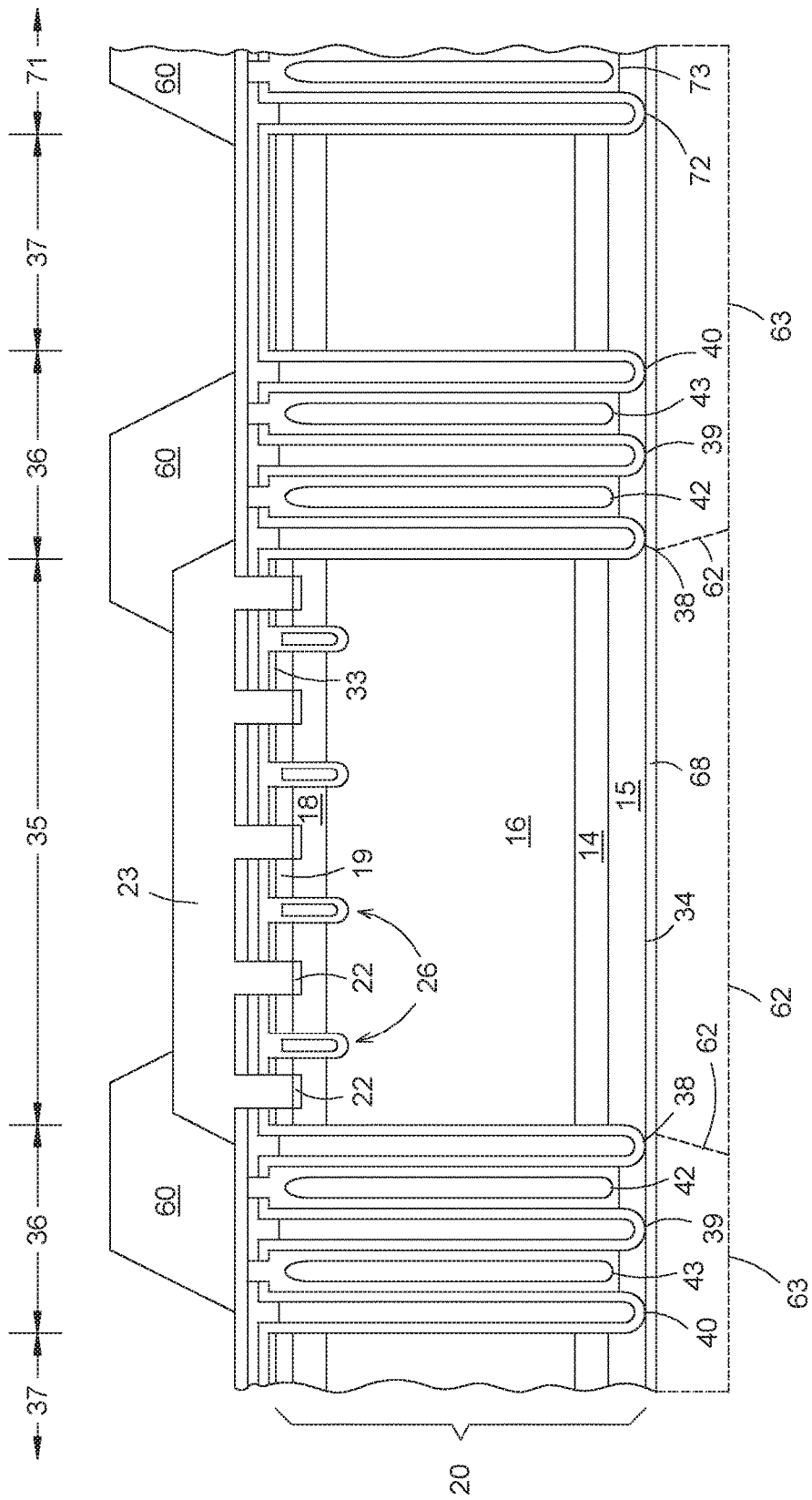
FIG. 9 illustrates the IGBT of FIG. 1 at a subsequent stage in accordance with the present invention.

FIG. 9 illustrates IGBT 10 at a subsequent stage. An embodiment may include that a conductor 23 may be formed in the openings overlying regions 22 to provide an electrical connection to region 18 and to region 19. Conductor 23 may function as the source electrode conductor for IGBT 10. Conductor 23 may, in some embodiments, extend to overlie structures 26.

Subsequently, a thick insulator 60 may be formed overlying trenches 38-42 to provide further insulation for IGBT 10. An embodiment may include that portions of bulk substrate 13 may thereafter be removed. Portions of substrate 13 that are at least in active area 35 may be removed to expose the surface of region 15 as illustrated by dashed lines 62. In other embodiments, the removal operation or removal step may include that other portions of bulk substrate 13 that are in termination region 36 may also be removed as illustrated by dashed lines 63. In an embodiment, bulk substrate 13 may be removed by back grinding methods such as chemical-mechanical polishing (CMP) or mechanical grinding. In one embodiment, bulk substrate 13 may be removed by CMP operations. The insulator of trenches 38-42 may function as a CMP stop or CMP removal stop that prevents the CMP operation from removing material once the ends of trenches 38-40 are exposed. In other embodiments, the insulator of one or more of trenches 38-42 may function as a removal stop signal that indicates the removal of a sufficient amount of bulk substrate 13 to expose the insulator of one or more of trenches 38-42. In some embodiments, exposing the insulator of one or more of trenches 38-42 can cause a change of resistance of the rotating portion of the CMP equipment and this change in resistance may be used to identify that the insulator is exposed. In other embodiments, the removal operation may continue for a short time interval after identifying or after receiving the removal stop signal in order to remove additional amounts of substrate 13. In such a continued operation, the insulator material of trenches 38-42 is substantially not removed. Thus, a surface of region 15 that is opposite to surface 33 of substrate 20 remains as surface 34 of substrate 20 so that region 15 is overlying surface 34 of substrate 20. An embodiment may include that region 15 may be considered as a portion of substrate 20 having a conductivity type that is the same as the conductivity type of region 15.

An embodiment may include that substrate 13 or portions thereof may be removed by etching the material of bulk substrate 13, such as for example by dry etching or by wet etching the material. In some example embodiments layer 15 may act as a wet etch stop layer. An embodiment may include that portions of substrate 13 may be selectively removed such as for example, portions illustrated by dashed lines 62 may be selectively removed. One example of such methods is explained in U.S. Pat. No. 7,989,319 issued to Grivna et al. on Aug. 2, 2011 which is hereby incorporated herein by reference. In another embodiment portions of substrate 13, such as those illustrated by dashed lines 62, may be removed by etching the material of substrate 13 leaving portions of substrate 13, such as those portions illustrated by dashed lines 63. In an embodiment, the portions illustrated by dashed line 63 may protrude from the corners of IGBT 10 as supports 69 (see FIG. 11).

After removing the portions of substrate 13, a conductor 68 may be formed on the surface of substrate 20. Conductor 68 functions as a drain electrode conductor for IGBT 10.

Thereafter, IGBT 10 may be singulated from the wafer on which IGBT 10 was formed. The portions of the semiconductor wafer in singulation regions 37 may be removed to perform the singulation. For example, the portions of the semiconductor wafer, such as for example portions of substrate 20, in regions 37 may be removed by etching through the semiconductor wafer, thus through portions of substrate 20. In an embodiment, the etching may remove all or substantially all of the semiconductor material from the outer periphery of termination trench 40. Thus, leaving IGBT 10 singulated from the semiconductor wafer as illustrated in FIG. 1.

In some embodiments, a small amount of residual semiconductor material 85 may remain in termination region 36. For example, material 85 may underlie some of trenches 42-43. Trenches 38-40 separate material 85 from regions 15 and 16 so that there is no direct electrical connection between material 85 and regions 14, 15, 16, 18, or 19 or conductor 68. An embodiment may include that the thickness of material 85 is less than the thickness of region 15. However, in other embodiments the depth of trenches 42-43 may be formed to be substantially equal to the depth of trenches 38-40 such that substantially no semiconductor material remains in termination region 36.

Region 36 is formed to have a width 45 that is substantially less than the width of the termination region in prior IGBTs which reduces the area of IGBT 10 thereby reducing the manufacturing cost. An embodiment may include that width 45 may be approximately twenty (20) microns. In another embodiment width 45 may be approximately thirty (30) microns. Other embodiments may include that width 45 may be a distance of approximately twenty (20) microns to approximately 30 microns. Thus, width 45 is smaller than the approximately three hundred to approximately five hundred (300-500) microns used for some prior IGBT devices. Additionally, since dopants don't have to be diffused into semiconductor material to form the termination region, the manufacturing time for forming IGBT 10 is also reduced which also reduces manufacturing cost.

Figure 10:
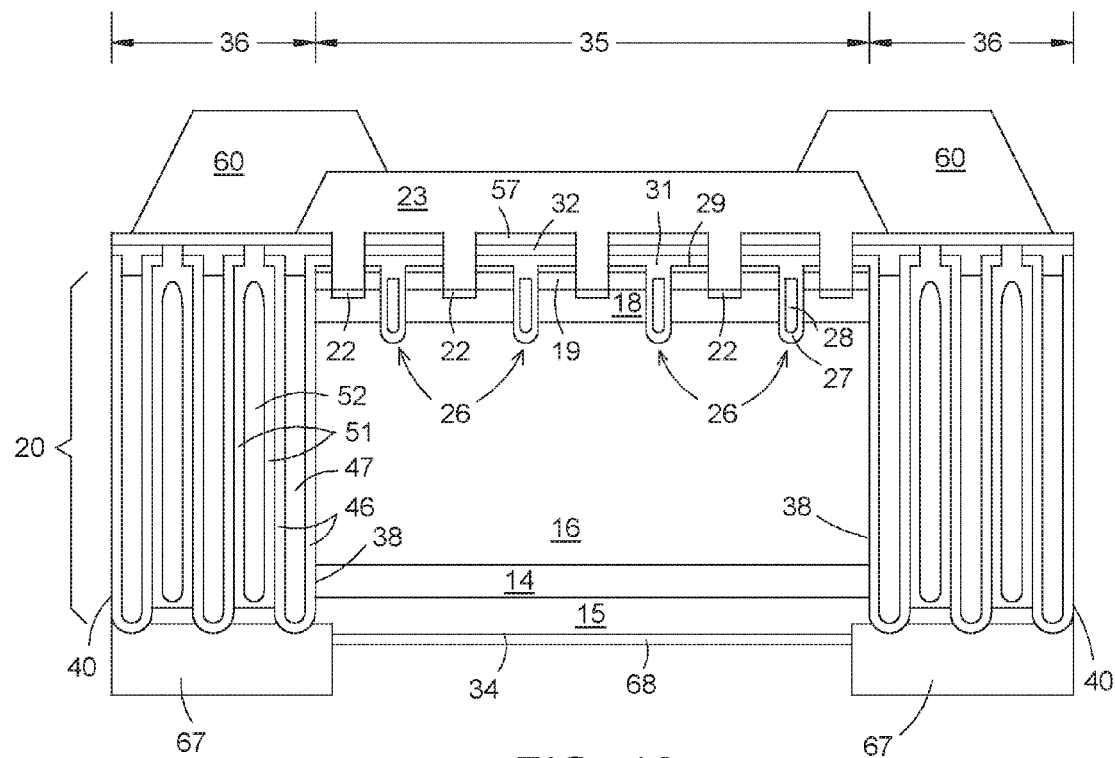
FIG. 10 illustrates an example of a portion of an alternate embodiment of the IGBT of FIG. 1 in accordance with the present invention.

Referring to FIG. 10, in another embodiment, an optional insulator 67 may be formed underlying trenches 38-42. Insulator 67 may be formed on a portion of surface 34 of substrate 20. For example, insulator 67 may be formed on the portion of surface 34 that underlies trenches 38-42. In some embodiments, a portion of insulator 67 may extend to underlie some of or a portion of region 15. Insulator 67 may be formed from any of the same types of material as insulator 57. In one example embodiment, insulator 67 may be formed covering all of surface 34 and subsequently patterned to expose portions of region 15. Conductor 68 may be formed after patterning insulator 67. The patterning of insulator 67 may be accomplished by etching the material of insulator 67. Insulator 67 may assist in increasing the breakdown voltage of IGBT 10, such as the non-limiting example embodiment of increasing the lateral breakdown voltage.

In another embodiment, insulator 67 may be selectively formed underlying trenches 38-42. In an embodiment, conductor 68 may be formed after selectively forming insulator 67. An embodiment may include not forming insulator 67 in region 37 or removing insulator 67 from region 37 prior to singulating IGBT 10 from the semiconductor wafer.

Insulator 67 may be formed by a variety of methods. For example, an insulator layer may be formed on another wafer (not shown), such as for example a handle wafer, and the insulator layer may be wafer bonded to substrate 20. For example the handle wafer may be bonded to the wafer that includes substrate 20. Thereafter, the handle wafer may be removed leaving the insulator layer on substrate 20, such as for example on the wafer that includes substrate 20. The insulator layer may be patterned to form insulator 67. In an embodiment, region 15 may function as an etch stop layer during the patterning of the insulator layer to form insulator 67.

Figure 11:
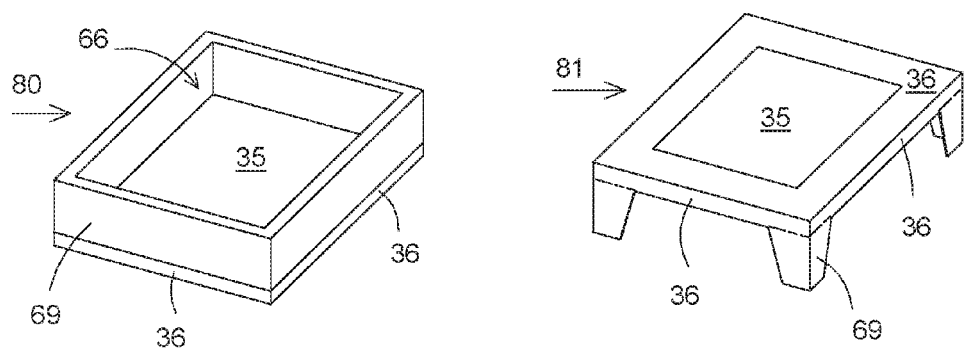
FIG. 11 illustrates example embodiments of portions of semiconductor devices that may be alternate embodiments of the IGBT of FIG. 1 in accordance with the present invention.
Figure 12:
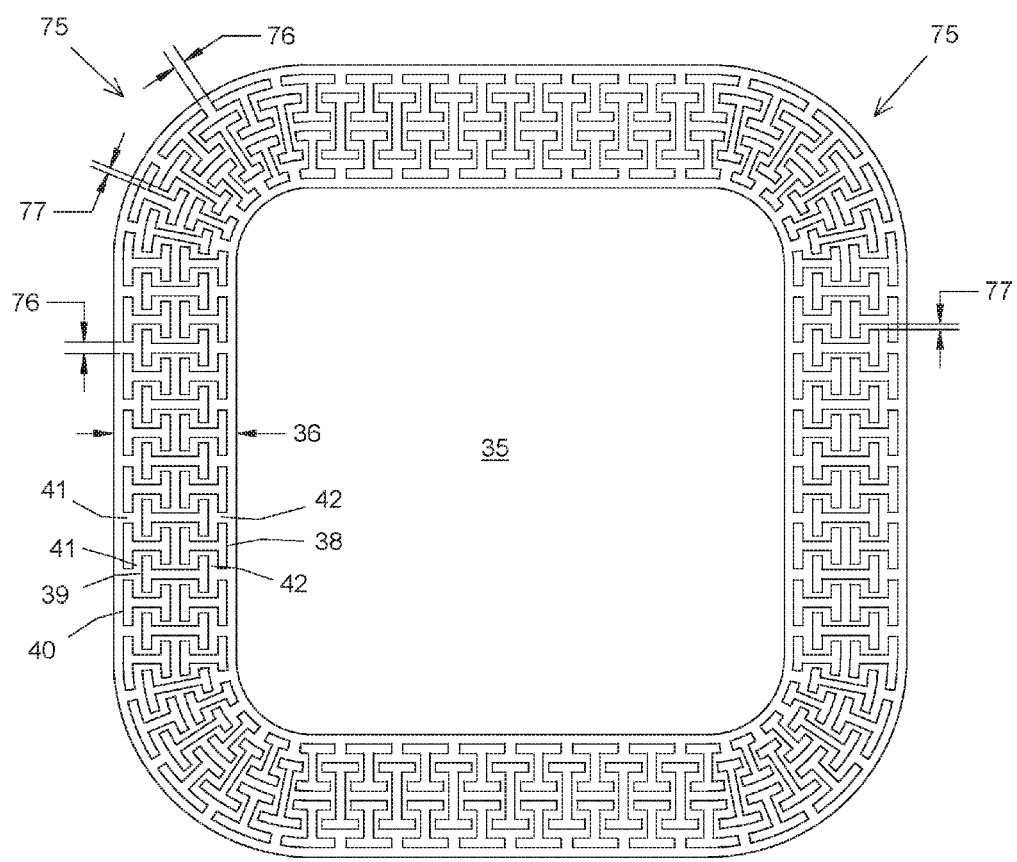
FIG. 12 illustrates an enlarged plan view of a portion of an example of an alternate embodiment of portions of the IGBT of FIG. 1 in accordance with the present invention.

FIG. 11 illustrates example embodiments of portions of semiconductor devices 80 and 81. In most embodiments, devices 80 and 81 may be substantially similar to IGBT 10. FIG. 11 illustrates a top isometric view of device 81 and a bottom isometric view of device 80. Device 81 includes supports 69 that extend from surface 34 of substrate 20 such as for example near to or at the corners of substrate 20. Although device 81 is illustrated to have square corners, in some embodiments the corners may be rounded as illustrated in FIGS. 2 and 12. In one embodiment, insulator 67 illustrated in FIG. 10 may be formed to have a thickness that is sufficient to form supports 69.

For the embodiment of device 80, supports 69 may be formed to surround the outer periphery of substrate 20 thereby leaving an opening 66 on the bottom of device 80.

FIG. 12 illustrates an enlarged plan view of a portion of an example of an alternate embodiment of region 36 along with trenches 38-42. In an embodiment, any or all of trenches 38, 39, and 40 may be formed to have a shape substantially similar to the letter "I" or similar to an I-beam such as may be seen in a cross-section of a steel I-beam. The "I" shape is illustrated in the plan view of the trenches. Trenches 38-40 are formed such that a spacing 76 between adjacent portions of trenches 38 and a spacing 77 between trenches 38 and 39 are substantially constant even along rounded corners 75. In an embodiment, the spacing between trenches 39 and 40 also may remain substantially constant through region 36 even in corners 75. The substantially constant spacing may assist in improving the process control, film stresses, and reducing the manufacturing cost of IGBT 10.

From all the foregoing, one skilled in the art will understand that an embodiment of an IGBT may comprise:

a semiconductor substrate, such as for example substrate 20, having a first surface, such as for example a bottom, and a second surface, such as for example a top, that is disposed opposite to the first surface;

a first doped region, such as for example region 15, of a first conductivity type, P-type in a non-limiting example, overlying the first surface wherein a first P-N junction is formed along the first doped region, for a non-limiting example a P-N junction may be formed along region 15 and one of regions 16 or 14;

a second doped region, such as for example region 18, of the first conductivity type on the second surface of the semiconductor substrate and extending a first distance into the semiconductor substrate;

a third doped region, such as for example region 19, having a second conductivity type in the second doped region and extending a second distance into the second doped region; and a plurality of termination trenches, such as for example 38-43, in a termination region, such as for example 36, of the semiconductor device, the plurality of termination trenches surrounding an outer perimeter of the second doped region and extending from the second surface toward the first surface wherein at least a portion of an end of one or more termination trenches of the plurality of termination trenches extends through the first surface.

An embodiment may include that an end of each termination trench of the plurality of termination trenches may extend through the first surface.

Another embodiment may include that a first termination trench of the plurality of termination trenches may have an insulator along sidewalls, along a first end, and along a second end of the first termination trench with a space, such as for example 47/52, interior to the first termination trench with the space positioned between the insulator that is along sidewalls, along the first end, and along the second end of the first termination trench.

In an embodiment, the space may be one of evacuated to less than atmospheric pressure, or a vacuum, or partial vacuum, or filled with a gas.

An embodiment may include that one or more termination trenches of the plurality of termination trenches has an insulator along sidewalls, along a first end, and along a second end of the one or more termination trenches with a space, such as for example one of spaces 47 or 52, positioned between the insulator that is along sidewalls, along the first end, and along the second end of the one or more termination trenches.

Another embodiment may include that one or more termination trenches of the plurality of termination trenches may have an insulator along sidewalls, along a first end, and along a second end of the one or more termination trenches with a conductor positioned interior to the one or more termination trenches with the conductor positioned between the insulator that is along sidewalls, along the first end, and along the second end of the one or more termination trenches.

In an embodiment, the conductor may be doped polysilicon.

An embodiment may include that an interface between the second and third doped regions forms a second P-N junction and an interface between the second doped region and a portion of the semiconductor substrate, such as for example doped region 16, forms a third P-N junction, and wherein at least one termination trench of the plurality of termination trenches abuts distal ends of the first, second and third P-N junctions.

An embodiment may include that a plurality of gate structures may extend through the third doped region and into the second doped region.

Another embodiment may include that a plurality of gate structures may extend through the second and third doped regions and into an underlying region, such as for example region 16.

Those skilled in the art will understand from all the foregoing that an embodiment of a semiconductor device may comprise: a semiconductor material, such as for example doped region 16, of a first conductivity type, such as for example N-type in a non-limiting example, having a first surface, such as for example the surface adjacent to region 15, and a second surface, such as for example at surface 33, that is disposed opposite to the first surface;

a first doped region, such as the non-limiting example of region 15, of a second conductivity type on the first surface;

a second doped region, such as the non-limiting example of region 18, of the second conductivity type on the second surface, such as for example top, of the semiconductor material and extending a first distance into the semiconductor material;

a third doped region, such as for example region 19, having the first conductivity type, the third doped region positioned in the second doped region and extending a second distance into the second doped region; and a plurality of termination trenches, such as for example trenches 38-43, in a termination region of the semiconductor device, the plurality of termination trenches surrounding an outer periphery of the first doped region and extending from the second surface toward the first surface wherein at least a portion of at least one termination trench, such as the non-limiting example of trench 38, of the plurality of termination trenches abuts the outer periphery of the first doped region and an outer periphery of the second doped region.

Another embodiment may include that at least a portion of the plurality of termination trenches extend into the first doped region.

In another embodiment, at least a portion of the plurality of termination trenches may extend through the first doped region.

An embodiment may include that at least a portion, such as for example trench or alternately trenches 38-40, of the plurality of termination trenches extend into the first doped region.

An embodiment may include that at least a portion, such as for example trench or alternately trenches 38-40, of the plurality of termination trenches extend through the first doped region.

Another embodiment may include that the first, second and third doped regions are a portion of one of a thyristor, a JFET, a MOSFET, a bipolar junction transistor, a SiC FET, or a GaN/Si FET.

An embodiment may include that one or more termination trenches of the plurality of termination trenches has an insulator along sidewalls, along a first end, and along a second end of the one or more termination trenches with a conductor positioned interior to the one or more termination trenches with the conductor positioned between the insulator that is along sidewalls, along the first end, and along the second end of the one or more termination trenches, where at least one end is p-n junction.

In an embodiment, a first P-N junction may be formed along the first doped region and wherein the at least one termination trench abuts distal ends of the first P-N junction and wherein the distal ends are substantially adjacent the outer periphery of the first doped region.

An embodiment may include that the second doped region forms a second P-N junction with the semiconductor material, such as for example between regions 18 and 16, and the at least one termination trench abuts distal ends of the second P-N junction and wherein the distal ends are at substantially the outer periphery of the second doped region.

Another embodiment may include that each termination trench of the plurality of termination trenches include an insulator material and wherein the insulator material of each termination trench of the plurality of termination trenches abut each other so that substantially no doped semiconductor material is disposed between any of the plurality of termination trenches.

In an embodiment, an outer periphery of the plurality of termination trenches may form an outer periphery of a die on which the semiconductor device is disposed and wherein the outer periphery of the plurality of termination trenches is substantially devoid of doped semiconductor material.

An embodiment may include that the at least one termination trench may also abut the third doped region along an outer periphery of the third doped region.

Those skilled in the art will understand from all the foregoing that an embodiment of a method of forming a semiconductor device may comprise:

providing a semiconductor substrate, such as for example substrate 13;

forming a first doped region, such as for example region 15, of a first conductivity type, such as P-type in a non-limiting example, on the semiconductor substrate;

forming a second doped region, such as for example region 16, of a second conductivity type overlying the first doped region, the second doped region having a first surface, such as for example top of 16, that is opposite to the first doped region;

forming a third doped region, such as for example region 18, having the first conductivity type on the first surface of the second doped region;

forming a fourth doped region, such as for example region 19, of the second conductivity type in the third doped region;

forming a plurality of termination trenches extending through the third doped region and into the first doped region wherein the plurality of termination trenches surround the first, second, third, and fourth doped regions; and removing a portion of the semiconductor substrate to expose the first doped region.

An embodiment of the method may include one of a) removing the portion of the semiconductor substrate using one of chemical-mechanical polishing, or grinding, or dry etching to perform the removing wherein the plurality of termination trenches provide a removal stop that substantially stops the removing upon exposing ends of the plurality of termination trenches or that can be used for forming a removal stop signal that identifies substantially exposing ends of the plurality of termination trenches, or b) etching the semiconductor substrate with a wet chemical etch wherein the etching substantially stops upon exposing the first doped region.

In an embodiment, the method may include forming a conductor material, such as a non-limiting example of conductor 68, on the first doped region.

Another embodiment may include forming a plurality of first trench opening, such as for example the openings for trenches 38-40, in a termination region of the semiconductor device wherein a first semiconductor material, such as for example portion 55, may be disposed between the plurality of first trench opening;

forming a first insulator along sidewalls and a bottom of each first trench opening;

forming a cap on top of the plurality of first trench openings thereby closing the top of each first trench opening and leaving a first space in an interior of each first termination trench of the plurality of termination trenches;

removing the first semiconductor material, such as for example portions 55, to form a plurality of second trench openings, such as for example the openings for trenches 42-43, disposed between each first termination trench; and forming a third insulator on sidewalls and a bottom of each second trench opening and leaving a second space in an interior of each second termination trench of the plurality of termination trenches.

Another embodiment may include forming at least one termination trench of the plurality of termination trenches abutting the first doped region and the third doped region.

In view of all of the above, it is evident that a novel device and method is disclosed. Included, among other features, is forming a semiconductor device to include plurality of termination trenches in a termination region of the semiconductor device. The termination trenches reduce the area of the semiconductor device thereby reducing the cost. The termination trenches also reduce the time required for manufacturing the device (as explained in the example hereinbefore) thereby also reducing the manufacturing costs. Furthermore, the termination trenches reduce the minority carrier injection caused by junction termination thereby increasing the switching speed of the device.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. As will be appreciated by those skilled in the art, the example form of IGBT 10 is used as a vehicle to explain the one example method of forming the semiconductor device. However, the method is directly applicable to other devices and other transistor structures. For example, although the descriptions illustrate semiconductor device materials that include silicon, other semiconductor material such as GaAs, GaN, SiC, diamond, Ge, CdTe, and the like may also be used. The material can be bulk substrate, homo-epitaxy or hetero-epitaxy of dissimilar semiconductors. Additionally the described trenches and methods therefor including doped regions 15, 16, 18, and 19, may be a portion of one of a thyristor, a JFET, a MOSFET, a bipolar junction transistor, a SiC FET, or a GaN/Si FET instead of an IGBT or RB-IGBT.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a semiconductor device comprising:
   providing a semiconductor substrate of a first conductivity type;
   forming a first doped region of a second conductivity type on the semiconductor substrate;
   forming a second doped region of the first conductivity type overlying the first doped region the second doped region having a first surface that is opposite to the first doped region;
   forming a third doped region having the second conductivity type on the first surface of the second doped region;
   forming a fourth doped region of the first conductivity type in the third doped region;
   forming one or more gate structures extending through the fourth doped region;
   forming a plurality of termination trenches extending through the third doped region and into the first doped region wherein the plurality of termination trenches surround the first, second, third, and fourth doped regions and the one or more gate structures; and
   removing a portion of the semiconductor substrate to expose the first doped region.

2. The method of claim 1 wherein removing the portion of the semiconductor substrate includes one of,
   a) removing the portion of the semiconductor substrate using one of chemical-mechanical polishing, or grinding, or dry etching to perform the removing wherein the plurality of termination trenches provide a removal stop signal that identifies substantially exposing ends of the plurality of termination trenches, or
   b) etching the semiconductor substrate with a wet chemical etch wherein the etching substantially stops upon exposing the first doped region.

3. The method of claim 1 further including forming a conductor material on the first doped region.

4. The method of claim 1 wherein forming the plurality of termination trenches includes forming at least one termination trench of the plurality of termination trenches abutting the first doped region and the third doped region.

5. The method of claim 1 wherein forming the plurality of termination trenches includes forming one or more of the termination trenches in a termination region of the semiconductor device and forming the one or more gate structures in an active region of the semiconductor device.

6. A method of forming a semiconductor device comprising:
   providing a semiconductor substrate of a first conductivity type;
   forming a first doped region of a second conductivity type on the semiconductor substrate;
   forming a second doped region of the first conductivity type overlying the first doped region the second doped region having a first surface that is opposite to the first doped region;
   forming a third doped region having the second conductivity type on the first surface of the second doped region;
   forming a fourth doped region of the first conductivity type in the third doped region;
   forming a plurality of termination trenches extending through the third doped region and into the first doped region wherein the plurality of termination trenches surround the first, second, third, and fourth doped regions including,
   forming a plurality of first trench opening in a termination region of the semiconductor device wherein a first semiconductor material is disposed between the plurality of first trench opening,
   forming a first insulator along sidewalls and a bottom of each first trench opening,
   forming a cap on top of the plurality of first trench openings thereby closing the top of each first trench opening and leaving a first space in an interior of each first termination trench of the plurality of termination trenches,
   removing the first semiconductor material to form a plurality of second trench openings disposed between each first termination trench, and
   forming a third insulator on sidewalls and a bottom of each second trench opening and leaving a second space in an interior of each second termination trench of the plurality of termination trenches; and
   removing a portion of the semiconductor substrate to expose the first doped region.

\* \* \* \* \*